United States Patent [19]

Banu et al.

[11] Patent Number: 4,509,019
[45] Date of Patent: Apr. 2, 1985

[54] TUNABLE ACTIVE FILTER

[75] Inventors: Mihai Banu, Woodside; Yannis Tsividis, New York, both of N.Y.

[73] Assignee: AT&T Bell Laboratories, Murray Hill, N.J.

[21] Appl. No.: 461,532

[22] Filed: Jan. 27, 1983

[51] Int. Cl.³ .............................................. H03F 3/04
[52] U.S. Cl. .................................... 330/107; 330/109; 330/305
[58] Field of Search ................... 330/107, 109, 84, 305

[56] References Cited

U.S. PATENT DOCUMENTS

| 3,500,223 | 3/1970 | Thurnell | 330/30 |
| 3,747,007 | 7/1973 | Geitner | 330/51 |
| 4,329,599 | 5/1982 | Gregorian et al. | 307/520 |
| 4,356,451 | 10/1982 | Wilson | 330/107 |

OTHER PUBLICATIONS

"Fully Integrated Analog Filters Using Bipolar-JFET Tech.," K. Tan et al., IEEE Journal of Solid-State Circuits, vol. SC-13, No. 6, Dec. 1978, pp. 814–821.
"A Low-Noise Chopper-Stabilized Differential Switched-Capacitor Filtering Technique," K. Hsieh et al., IEEE Journal of Solid-State Circuits, vol. SC-16, No. 6, Dec. 1981, pp. 708–715.
"A Continuous-Time Analog Filter Using MOS Technology," W. Kellner, Frequenz, vol. 35, 1981, pp. 340–343.
"FET Limits and Resets Operational Amplifiers," Electronic Design, P. A. Ralatos, Nov. 1965, (2 pages).
"Operation of a MOS Transistor as a Variable Resistor," Bilotti, Proceedings of the IEEE, Aug. 1966, pp. 1093–1094.

Primary Examiner—James B. Mullins
Assistant Examiner—G. Wan
Attorney, Agent, or Firm—James H. Fox

[57] ABSTRACT

A tunable high-pass or low-pass filter employs a balanced amplifier having electronically controlled elements in either the two input or the two feedback paths (or both). A reactive element is placed in the other of the paths. Especially low distortion results from this arrangement, allowing convenient integrated circuit implementation with a nonlinear device (e.g., MOS transistor) as a voltage-controllable element. Multiple stages can be cascaded and controlled from a reference clock or other precision source for high accuracy.

7 Claims, 10 Drawing Figures

TUNABLE ACTIVE FILTER

BACKGROUND OF THE INVENTION

1. Field of the Invention

This invention relates to an active filter that has a tunable frequency response.

2. Description of the Prior Art

In the past several years, several filter designs have emerged that can be largely or entirely integrated onto a single semiconductor chip. Such filters are increasingly useful in telecommunications applications wherein it is necessary to provide filtering for voice or data channels, and numerous other applications. Filters are also widely used for testing and measuring, instrumentation, signal recovery, etc. Among the technologies that have been considered for integrated filters include charge-coupled devices (CCD) and switched capacitor filters. In addition, nonswitched filtering has also been investigated. In some respects, the nonswitched circuits are preferable, as none of the problems related to sampling the desired signal are present. In addition, the circuits are not limited by the maximum sampling rate at which the switched capacitor can be operated.

In order to obtain highly accurate time constants, it is possible to utilize a stable clock waveform for the adjustment of circuit time constants; see, for example, "Fully Integrated Analog Filters Using Bipolar-JFET Technology," by K. S. Tan et al in *IEEE Journal of Solid-State Circuits*, Vol. SC-13, pages 814-821 (1978). In that technique, an adjustable time constant is obtained by utilizing a voltage-controlled element. By comparing the time constant of one such tunable circuit on an integrated circuit chip to the reference clock, corrective feedback can be used to adjust the value of a multiplicity of other time constants. This is because on a single integrated circuit chip, the repeatability of devices from one tunable circuit to another is good. However, this technique relies upon the availability of a control element that can be conveniently integrated on a chip and which allows for a suitable range of time constants to be obtained. One prior art control element has been a differential pair of field effect transistors operated in a variable transconductance mode that responds to a control voltage; see the above-noted article by K. S. Tan et al at FIG. 6, etc.

In a voltage-controlled time-constant circuit, it is desirable to obtain a control element that can be implemented as simply as possible. It is also desirable that all active devices be implemented using a single technology, such as MOS technology, rather than using mixed device technology, such as both bipolar and MOS, on a single chip. In addition, it is necessary that the control circuitry obtain a high degree of linearity to obtain suitably low distortion. This allows, for example, signals having widely varying amplitudes to be filtered without excessive distortion or noise. An additional requirement for a useful implementation of a tunable filter is that the control element be readily integrated, preferably using standard semiconductor device processing techniques.

SUMMARY OF THE INVENTION

We have invented a tunable filter comprising a balanced amplifier having inverting and noninverting inputs and inverted and noninverted outputs. A first input path connects to an inverting input, and a second input path connects to a noninverting input. A first feedback path connects a noninverted output to said inverting input. A second feedback path connects an inverted output to said noninverting input. An electronically controlled resistance is placed in each of the first and second input paths, or each of the first and second feedback paths. A reactance element is placed in each of the other of said paths. The control element is typically an MOS transistor, which acts as a voltage-controlled resistor and can be nonlinear in its characteristics. The reactance element is typically a capacitor. A low-pass filter can be obtained with capacitors located in the feedback paths and voltage-controlled resistors in the input paths. A high-pass filter can be obtained with capacitors in the input paths and voltage-controlled resistors in the feedback paths. Multiple filters can be cascaded for more complex frequency responses and can be referenced to a precision reference, such as an accurate clock frequency or stable resistor.

DETAILED DESCRIPTION

The following detailed description refers to a tunable active filter. Both high-pass and low-pass filters can be implemented according to the present technique. In addition, more complex filter designs, including band-pass or band-reject filters, can be implemented by interconnecting a multiplicity of high-pass and/or low-pass filters of the inventive design.

In the present technique, a fully integrated active RC filter can be implemented on a single semiconductor chip using a standard topology with resistors, capacitors, and operational amplifiers. Such implementation makes speedy design possible, as compared to the design of switched capacitor filters. In addition, several drawbacks associated with the latter are avoided, such as noise folding into the baseband, switching noise outside the baseband, and the need for antialiasing and output-smoothing filters. The variable time constants in the present technique can be adjusted and stabilized by comparison to a precision source, such as a fixed clock period; see the Tan article above. If desired, the precision source can be obtained off-chip, such as a system timing signal.

Figure 1:
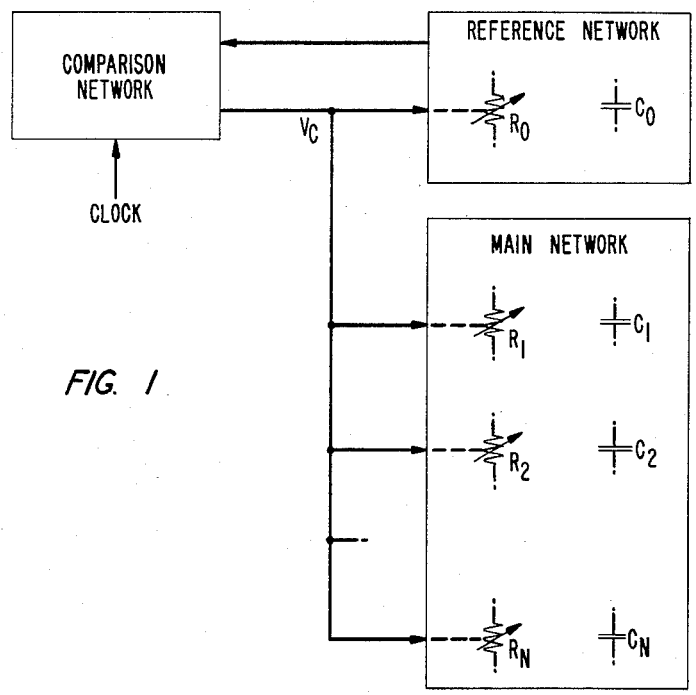
FIG. 1 shows a general method of obtaining time constants that are referenced to a clock frequency.

One general scheme for implementing this idea is shown in FIG. 1. The scheme of FIG. 1 is based on the realization of voltage-controlled resistors. The "main network" (e.g., filter) has variable time constants realized as RC products, where all the voltage-controlled resistors $R_i$ and all the capacitors $C_j$ are ratio-matched to some reference elements $R_0$ and $C_0$. Applying the proper controlling voltage $V_C$, the time constants of the main network can be adjusted to precise and stable values. This is done automatically by a control system consisting of the "comparison network" and the "reference network". The latter is synthesized with $R_0$ and $C_0$ elements to generate an output signal which is a function of its characteristic time constant $\tau_0 = R_0 C_0$ (e.g., this output signal may be an oscillation of period $\tau_0$). The comparison network sets the voltage $V_C$ (and indirectly $\tau_0$) such that the signal coming from the reference network compares to a stable and fixed clock period in a predetermined manner (e.g., $\tau_0$ equals the clock period). Thus, the value of $\tau_0$ becomes precise and stable. Since all the various time constants of the main network are ratioed to $\tau_0$, they too become stable and assume predetermined values.

Figure 2:
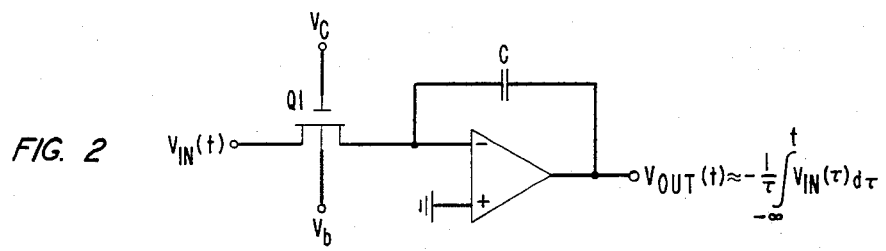
FIG. 2 shows a small signal, RC tunable integrator.

In principle, RC circuits can be implemented in the metal oxide silicon (MOS) technology by using the MOS transistor in the triode region as a voltage-controlled resistor, as shown, for example, in the integrator (low-pass filter) of FIG. 2. However, only very small signals can be handled by this scheme, due to the nonlinearity of the insulated gate field effect transistor (IGFET), which causes primarily second-order harmonic distortion. Common requirements are typically not met (e.g., THD less than 1% at signals of 6 V peak-to-peak with ±5 V power supplies and dynamic range of over 90 dB).

Figure 3:
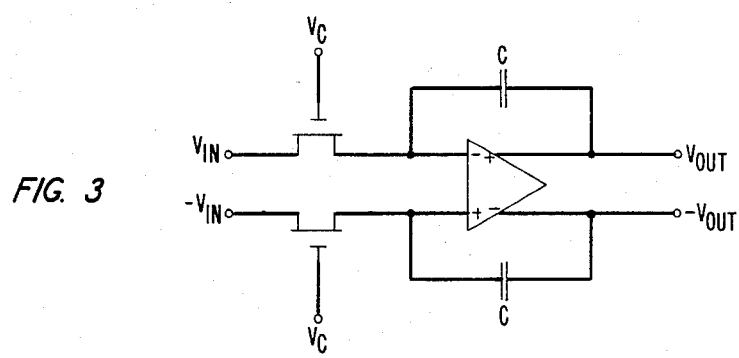
FIG. 3 shows a balanced RC tunable integrator according to the present invention.
Figure 4:
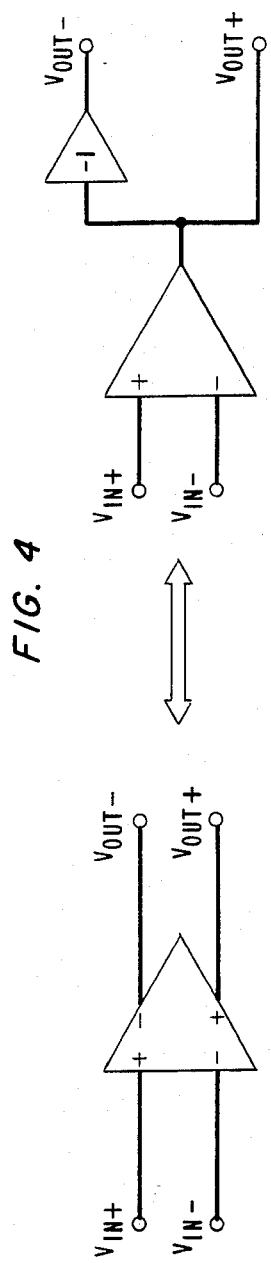
FIG. 4 shows the definition of the balanced amplifier utilized in the present technique.
Figure 5:
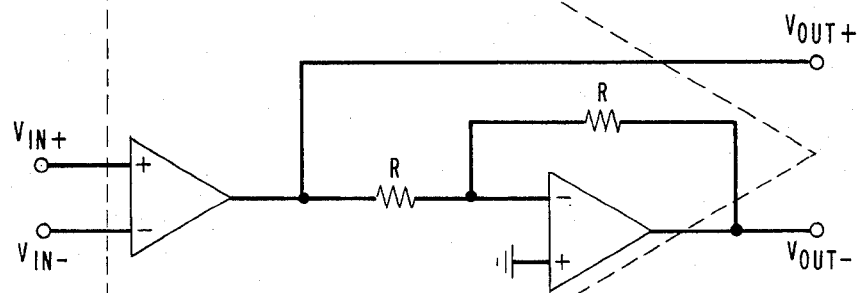
FIG. 5 shows one possible implementation of the balanced amplifier.

In the present invention, the foregoing problems are substantially reduced with the circuit shown in FIG. 3. In this circuit, the nonlinearity of the voltage-controlled resistances is sufficiently cancelled to reduce the total harmonic distortion at least 20 decibels, as compared to the circuit of FIG. 2, under expected operating amplitudes and frequencies. The balanced amplifier is a double-input, double-output operational amplifier, referred to herein as a "Complementary Output Operational Amplifier" (C.O. Op. Amp). The definition of the operation of this element and the symbol used to represent it are shown in FIG. 4. In the C.O. Op. Amp, the two output voltages are equal in magnitude and opposite in sign (i.e., are balanced). The input signals are required to be substantially equal in magnitude and opposite in sign, when compared to the same reference voltage that defines the balanced output. The reference voltage is defined herein as the signal ground potential, which can be the same as, or different than, the power supply ground potential, depending on the circuit used. If the inputs in FIG. 3 are symmetric (with respect to signal ground), it can be shown that the nonlinearity of the MOS transistors (MOSTs), which would normally give rise to second-order harmonics, cancels out. It has been found that even relatively large device mismatches of 2% in input transistor sizes or in the values of the integrating capacitors produce a relatively small increase in total harmonic distortion (THD). In addition, typical MOS fabrication techniques can match these values to better than 2%. The C.O. Op. Amp is considered balanced in FIG. 4 if the output voltages (OUT − and OUT +) have magnitudes that differ by no more than 2%. The same technique can be applied in realizing multiple-input integrators (by adding extra input transistors), summers (by replacing the capacitors with MOSTs), differentiators (by interchanging the capacitors with the MOSTs), etc. The filter building blocks thus obtained are input-output compatible. The above technique naturally leads to filters that are fully balanced from input to output, which is desirable for good power supply rejection. One suitable implementation of the C.O. Op. Amp is shown in FIG. 5, with others being possible.

The above principles will be more fully explained by means of the following Example:

EXAMPLE

Figure 9:
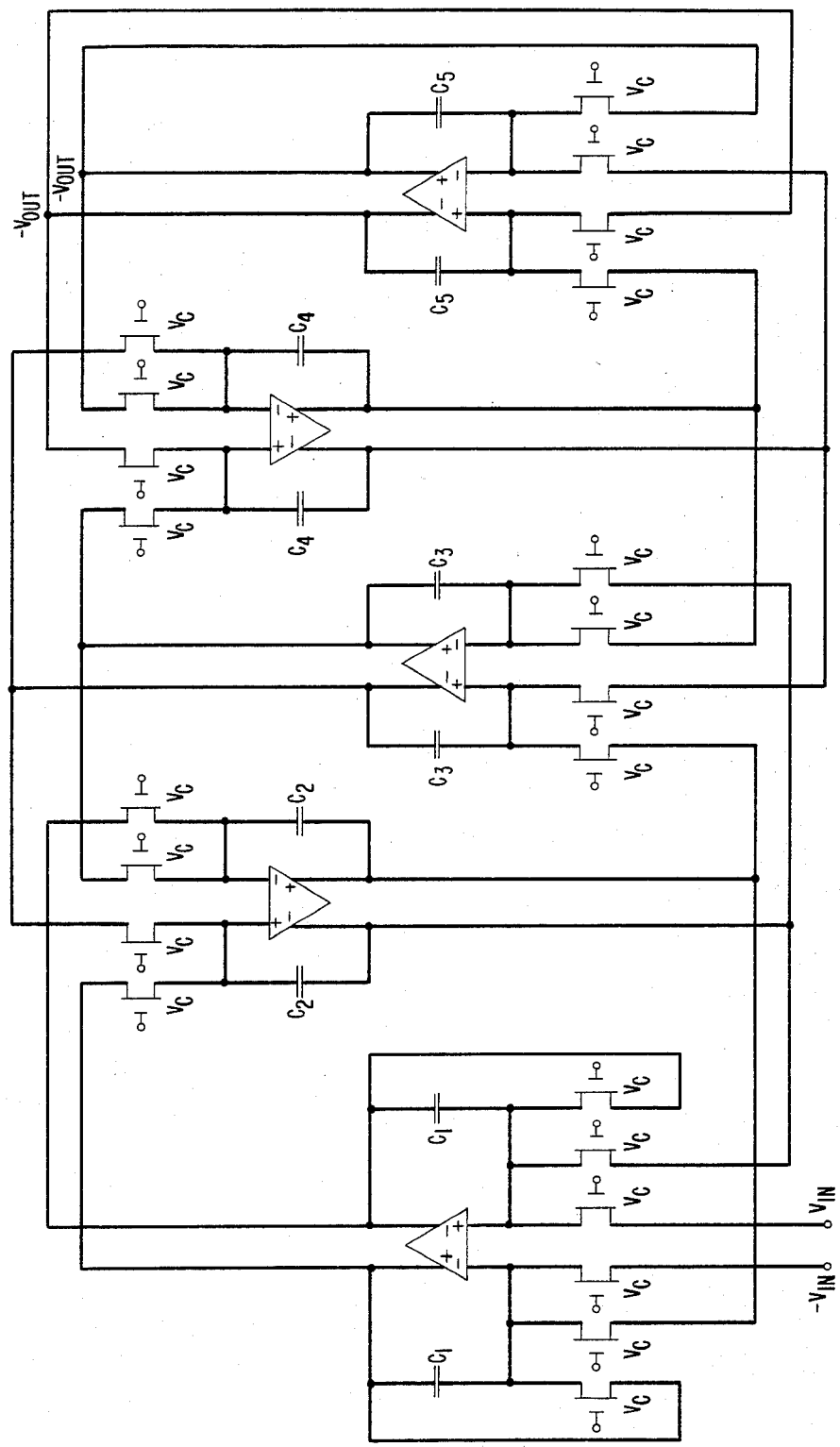
FIG. 9 shows a fifth-order low-pass filter according to the present invention.

A fifth-order low-pass active ladder filter converted to fully balanced topology is shown in FIG. 9. This design has been implemented in CMOS technology using 3.5 μm minimum linewidth. For the C.O. Op. Amps, the circuit of FIG. 5 was used, with P-tub resistors being used for R. For the controlled resistors, a careful layout was used to ensure adequate MOS transistor matching, although the requirements on the latter are not stringent for the topology used (if accurate matching is needed, self-tuning could be considered); see, e.g., "Self-Tuned Filters," Y. Tsividis, *Electronics Letters*, Vol. 17, pages 406–407 (1981). To reduce the inherent nonlinearity of the P-tub resistors, they were implemented with relatively large dimensions of 40×600 micrometers, for a resistance of about 35K ohms. The filter was designed from standard tables. Computer simulation showed some peaking in the frequency response due to distributed capacitance in the channel; this effect was eliminated by a trivial empirical adjustment of two capacitors using computer simulation as a guide. The resistance of the voltage-controlled MOST resistors in FIG. 5 was 4 megohms for $V_C - V_T = 4$ volts, where $V_T$ is the threshold voltage of the MOS transistors. The substrate of each MOST resistor was connected to $+V_{DD}$, the positive supply voltage. The values of the capacitors $C_1$–$C_5$, corresponding to integrators 1–5, are given in Table I. The MOST resistors were designed to be identical, and the integrator ratios were implemented by differences in the capacitors. In order to improve the MOST resistor matching, each resistor was split into four identical parts, which were interleaved with all the others. In this way, local process variations are averaged out for each MOST resistor. The capacitance matching was accomplished by combining typically from 10 to 25 smaller values. An unbalanced-to-balanced input converter and a balanced-to-unbalanced output converter were also included in the chip using op-amps and P-tub resistors. The chip worked as expected from simulation, exhibiting a cutoff frequency that ranged linearly from 1 kHz to 4 kHz for a control voltage ($V_C$) that ranged from −3 volts to −6 volts, respectively. Other measured performance parameters for the combination of the filter and the two converters are shown in Table II.

TABLE I

| | Component Values | | |
|---|---|---|---|
| Intergrator | $\tau^{-1}$ | MOST Resistor (MΩ) ($V_C - V_T = 4V$) | C (pF) |
| 1 | 15.34 × 10³ | 4 | 16.30 |
| 2 | 15.62 × 10³ | 4 | 16.00 |
| 3 | 8.9 × 10³ | 4 | 28.07 |
| 4 | 11.36 × 10³ | 4 | 22.00 |
| 5 | 15.34 × 10³ | 4 | 16.30 |

TABLE II

| Performance | |
|---|---|
| Power supply voltages | ±5V |
| Total harmonic distortion | <1% |

TABLE II-continued

| Performance | | |
|---|---|---|
| at 6V peak-to-peak output signal | | |
| C-message weighted noise | | 34 μV rms |
| Dynamic range | | 95 dB |
| Power supply rejection ratio | $+V_{DD}$ | +60 dB |
| (Measured at 1 kHz) | $-V_{SS}$ | +40 dB |
| Output offset | | 5 mV |
| Filter gain | | 0 dB |
| Power dissipation | | 20 mW |

The power dissipation of 20 mW reflects the fact that two op-amps were used per stage for simplicity, as in FIG. 5. The power supply rejection ratio (PSRR) measured was limited by the op-amps and not by the scheme itself. The dynamic range of 95 dB is limited by the noise of the MOST resistors, the value of which was chosen to minimize the total area. By decreasing the resistance values at the expense of the capacitance values, a dynamic range of over 100 dB should be possible. The active area of the chip was 4 mm$^2$ (including the converters).

It should be emphasized that the chip exhibited the performance in Table II the first time it was integrated; no redesign was necessary, which points to the design simplicity of the technique presented.

Figure 6:
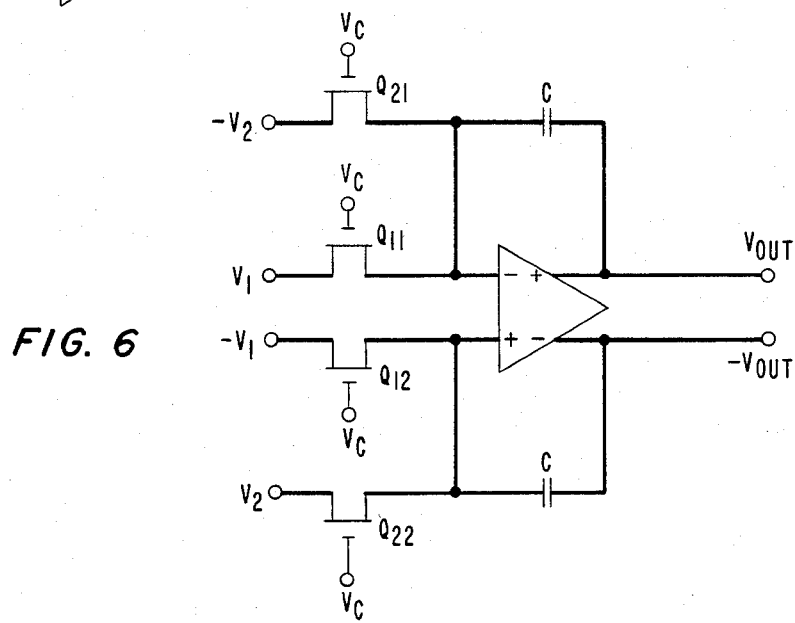
FIG. 6 shows a balanced differential integrator according to the present invention.

Note that in the circuit of FIG. 9, differential input integrators are used. Their output is proportional to the integral of ($V_1-V_2$), where $V_1$ and $V_2$ are independent inputs. This function is implemented by adding another pair of input transistors to the circuit shown in FIG. 3, and driving them in complementary fashion ($V_2$ and $-V_2$), as shown in FIG. 6. The circuit can be extended to integrate still other input voltages by adding additional input transistor pairs in a similar manner.

Figure 7:
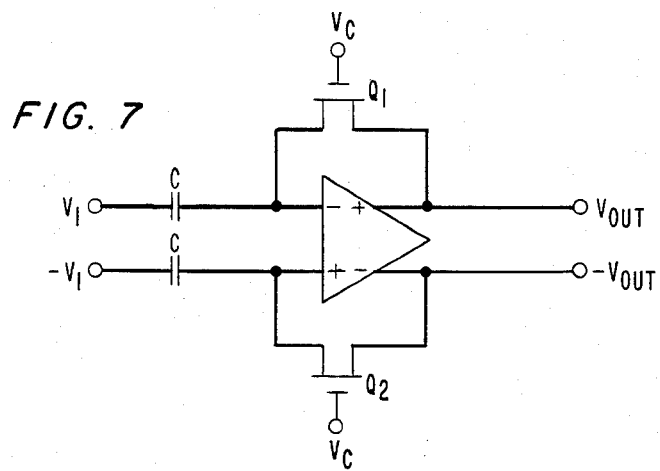
FIG. 7 shows a balanced tunable differentiator according to the present invention.

The linearizing effect of the above balanced design will also be obtained, with other reactor elements in place of the capacitors of FIG. 3 being utilized. For example, if an inductor replaces each capacitor, the circuit of FIG. 3 implements a differentiator (high-pass filter) of high linearity. In the above embodiments, feedback has been applied through linear elements, and nonlinear transistors have been used as the voltage-controlled input devices. However, it is also possible to obtain embodiments that do just the opposite. For example, the circuit of FIG. 7, wherein the voltage-controlled elements are in the feedback path and capacitors are in the input path, is a differentiator. While MOS transistors have been used as the controlled resistances in the Example herein, other electronically controlled elements are possible. That is, the present technique can advantageously be used to obtain a more linear response using other elements having less than ideal current versus voltage linearity. All such devices are included in the term "electronically controlled resistance," as used herein.

Figure 8:
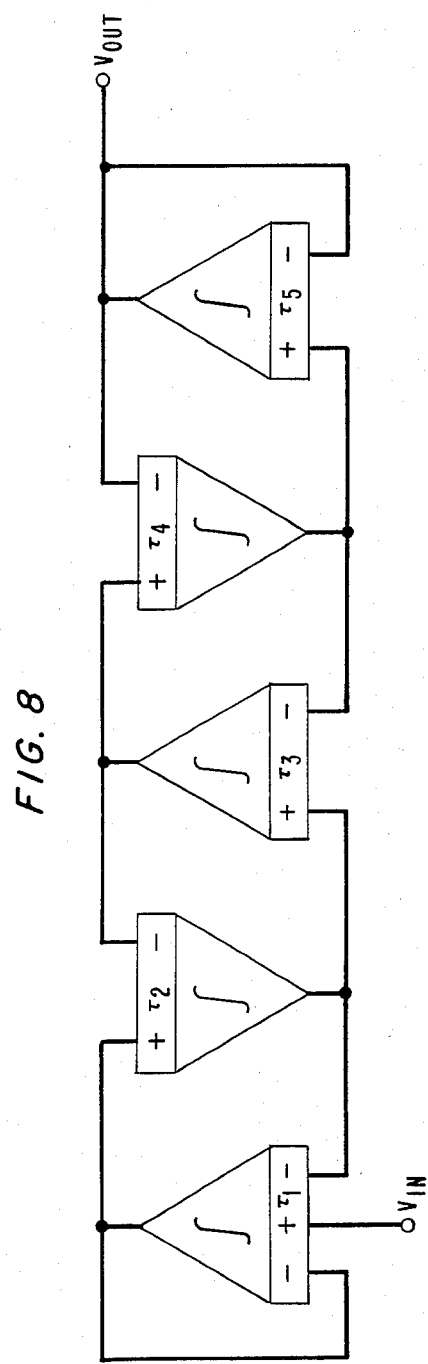
FIG. 8 show a fifth-order leapfrog filter diagram.
Figure 10:
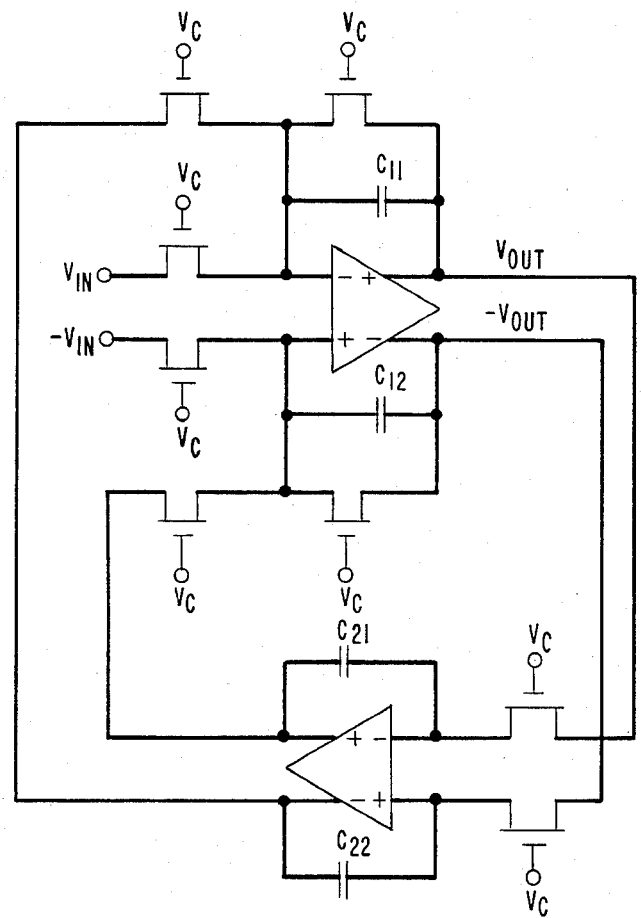
FIG. 10 shows the diagram for a second-order bandpass filter according to the present inventive technique.

With the above-noted circuits as building blocks, a wide variety of functions can be obtained. In network theory, it is known that all types of transfer functions can be realized, with very insensitive circuits containing only integrators and summers. For example, FIG. 8 shows the familiar leapfrog topology using only differential input integrators to realize a fifth-order low-pass transfer function, which is a generalized representation of the filter shown in FIG. 9. A realization of a second-order bandpass filter utilizing the present technique is shown in FIG. 10. Note that in all of the above, the voltage $V_C$ applied to the gates of the control transistors is the same voltage. Still other transfer functions can be realized using standard design techniques embodying the present inventive filter design.

This method for monolithic continuous time filter realization could be generalized to allow the implementation of programmable filters. One way to accomplish this is by switching on or off extra resistance or capacitance in the circuit (note that the filters remain continuous time in nature). This is similar to the switched capacitor programmable filters, with the exception that the switches themselves would become active parts of the circuit subject to linearization, just as all the other MOST resistors. In fact, the same FETs could be used as MOST resistors and switches, depending on the gate voltages applied. An alternative approach is to use a fixed topology and to control the different time constants independently such that the frequency response varies in a more general way than just a frequency axis scaling.

All such implementations of the present technique are within the scope of the present invention.

What is claimed is:

1. A filter comprising a balanced amplifier having an inverting input and a noninverting input, and an inverted output and a noninverted output, wherein a pair of first and second input paths are connected to said inverting input and said noninverting input, respectively, and wherein a pair of first and second feedback paths are connected between said noninverted output and said inverting input, and between said inverted output and said noninverting input, respectively, and wherein at least one of said pair of paths comprises an electronically controlled resistance in the form of a field effect transistor in each of said first and second paths therein, and wherein at least the other of said pair of paths comprises a reactive element in each of said first and second paths therein.

2. The filter of claim 1 wherein said reactive element is a capacitor.

3. The filter of claim 1 wherein said input paths each comprise said controlled resistance, and said feedback paths each comprises a capacitor, whereby a low-pass filter is obtained.

4. The filter of claim 1 wherein each of said input paths comprises a capacitor, and each of said feedback paths comprises said controlled resistance, whereby a high-pass filter is obtained.

5. The filter of claim 1 wherein the electronically controlled resistances therein are adapted to being controlled by reference to a precision source.

6. The filter of claim 1 wherein all of said elements are included on a single semiconductor chip.

7. The filter of claim 1 wherein the nonlinearity of said controlled resistances is sufficiently cancelled so that the total harmonic distortion introduced by said filter is at least 20 decibels less than if said controlled resistance and said reactance are located in only one of said first and second paths.

* * * * *